US008258577B2

United States Patent
Dixit

(10) Patent No.: US 8,258,577 B2
(45) Date of Patent: Sep. 4, 2012

(54) CMOS INVERTER DEVICE WITH FIN STRUCTURES

(75) Inventor: Abhisek Dixit, Karnataka State (IN)

(73) Assignee: International Business Machines Corporation, Armonk, NY (US)

( * ) Notice: Subject to any disclaimer, the term of this patent is extended or adjusted under 35 U.S.C. 154(b) by 280 days.

(21) Appl. No.: 12/478,222

(22) Filed: Jun. 4, 2009

(65) Prior Publication Data

US 2010/0308414 A1   Dec. 9, 2010

(51) Int. Cl.
  *H01L 29/66* (2006.01)
  *H01L 27/118* (2006.01)
  *H01L 21/00* (2006.01)
  *H01L 21/84* (2006.01)
  *H01L 21/336* (2006.01)
  *H01L 21/425* (2006.01)
  *G11C 11/00* (2006.01)

(52) U.S. Cl. . 257/365; 257/206; 257/401; 257/E21.661; 257/E27.09; 257/E27.062; 438/157; 438/176; 438/283; 438/525; 365/154

(58) Field of Classification Search .................. None
  See application file for complete search history.

(56) References Cited

U.S. PATENT DOCUMENTS

| 6,921,963 | B2 | 7/2005 | Krivokapic et al. | |
| 6,974,729 | B2 | 12/2005 | Collaert et al. | |
| 7,202,494 | B2 * | 4/2007 | Blanchard et al. | 257/9 |
| 7,214,991 | B2 * | 5/2007 | Yeo et al. | 257/401 |
| 7,297,581 | B1 * | 11/2007 | Hill et al. | 438/176 |
| 7,300,837 | B2 | 11/2007 | Chen et al. | |
| 7,612,420 | B2 * | 11/2009 | Lenoble | 257/401 |
| 2005/0029556 | A1 * | 2/2005 | Wang et al. | 257/250 |
| 2006/0138553 | A1 * | 6/2006 | Brask et al. | 257/369 |
| 2007/0065990 | A1 | 3/2007 | Degroote et al. | |
| 2007/0111419 | A1 * | 5/2007 | Doyle et al. | 438/197 |
| 2007/0114612 | A1 * | 5/2007 | Ahn et al. | 257/364 |
| 2007/0235763 | A1 * | 10/2007 | Doyle et al. | 257/202 |
| 2007/0257325 | A1 * | 11/2007 | Rachmady et al. | 257/401 |
| 2008/0050897 | A1 * | 2/2008 | Kottantharayil | 438/513 |
| 2008/0303095 | A1 * | 12/2008 | Xiong et al. | 257/365 |
| 2011/0018064 | A1 * | 1/2011 | Doornbos | 257/365 |

FOREIGN PATENT DOCUMENTS

JP    2007-235037 A  *  9/2007

OTHER PUBLICATIONS

Machine translation of Japanese Patent Publication No. JP 2007-235037 A to Yasuyoshi et al.*

* cited by examiner

*Primary Examiner* — Nathan Ha
*Assistant Examiner* — Michael Jung
(74) *Attorney, Agent, or Firm* — Patterson & Sheridan LLP

(57) ABSTRACT

A CMOS inverter formed with narrowly spaced fins structures including transistors formed on sidewalls of each fin structure. A high-k dielectric material is deposited on the fins to provide mechanical stability to the fins and serve as a gate dielectric material. A mid gap metal gate layer may be formed on the high-k dielectric layer.

26 Claims, 8 Drawing Sheets

CMOS INVERTER DEVICE WITH FIN STRUCTURES

BACKGROUND OF THE INVENTION

Description of the Related Art

Digital inverters are basic building blocks of modern integrated circuits such as memories, processors, multiplexers, decoders, and the like. A digital inverter receives a binary input having a first logical value and, in response, generates a second logical value at an output. The digital inverter is generally constructed with one or more transistors. Exemplary digital inverters include the n-channel metal-oxide semiconductor (NMOS) inverter, p-channel metal-oxide semiconductor (PMOS) inverter, complementary metal-oxide semiconductor (CMOS) inverter, and the like.

In recent years there has been an increasing demand to reduce the size of integrated circuits. For example, smaller integrated circuits are desirable in portable electronic devices such as cell phones, laptop computers, personal digital assistants, and the like. Forming smaller integrated circuits having at least the same (or better) specifications as their larger counterparts generally requires that the components of the integrated circuits, such as digital inverters, also be made commensurately smaller.

For example, CMOS inverters may be used in static random access memories (SRAMs) to form a memory cell. As is well known, there is an increasing demand for smaller devices with better performance. For example, there is an increasing demand for smaller SRAM chips with a greater amount of memory packed into each chip. One method for forming smaller SRAMs with greater capacity is to reduce the size of the CMOS inverters that form the memory cell, thereby allowing more memory cells to be packed into each unit area of the SRAM chip.

FIG. 1 illustrates an exemplary circuit diagram of a CMOS inverter circuit 100. As illustrated in FIG. 1, CMOS inverter circuit 100 may include a p-channel metal-oxide semiconductor field effect transistor (PMOSFET or PMOS) 110 and a n-channel metal-oxide semiconductor field effect transistor (NMOSFET or NMOS). As illustrated in FIG. 1, the gates of the PMOS 110 and the NMOS 120 may be connected to each other and may form an input 130 of the CMOS inverter. Furthermore, as illustrated in FIG. 1, the drain terminals of the PMOS 110 and the NMOS 120 may be coupled with one another and may form an output 140 of the CMOS inverter. The source terminal of the PMOS 110 may be coupled to a positive segment of a power grid (shown in FIG. 1 as $V_{DD}$), and the source terminal of the NMOS 120 may be coupled to a negative segment of the power grid (shown in FIG. 1 as $V_{SS}$).

As the demand for smaller and more densely packed integrated circuits continues to grow, innovative technologies for constructing smaller transistors continue to be developed and adopted. Fin Field Effect Transistor (FinFET) technology is one such innovative approach used to construct high performance, densely packed transistors on integrated circuits. A FinFET is a double gated or triple gated structure that is easily manufactured using current fabrication techniques. In a FinFET, a vertical fin is defined to form the body of a transistor. Gates can be formed on one or more sides of the vertical fin. Generally, the vertical fin has a gate formed on three sides of the fin. A portion of the gate oxide formed on top of the fin may determine whether the FinFET operates as a double gate or triple gate FinFET. A double-gate FinFET helps suppress short channel effects (SCE) and reduce leakage.

FIG. 2 illustrates an exemplary layout diagram of a conventional CMOS inverter 200 built using FinFET transistors. As illustrated in FIG. 2, the CMOS inverter 200 may generally include doped regions 210a-d, fin structures (or fins) 220a-d, and a gate structure 230. In one embodiment, the doped regions 210a-b and fins 220a-b may correspond to the PMOS transistor 110 illustrated in FIG. 1, and the doped regions 210c-d and fins 220c-d may correspond to the NMOS transistor 120 illustrated in FIG. 1. The doped region 210a and 210c may represent the drain terminals of the PMOS 110 and NMOS 120 respectively. Accordingly, the doped regions 210a and 210c may be connected by means of a metal layer 240. Contacts 270 may be formed using conventional techniques to couple the metal layer 240 with the doped regions 210a and 210c. The metal layer 240 may form the output terminal of the CMOS inverter 200.

The doped region 210b may form the source region of the PMOS 110. Accordingly, the doped region 210b may be coupled with a positive terminal of a power supply by means of a metal layer 250. As shown in FIG. 2, contacts 280 may be formed to couple the metal layer 250 with the doped region 210b. The doped region 210d may form the source region of the NMOS 120. Accordingly, the doped region 210d may be coupled with a negative terminal of a power supply by means of a metal layer 260. As shown in FIG. 2, contacts 290 may be formed to couple the metal layer 290 with the doped region 210d.

The fin structures 220a-d may include the channel regions of the PMOS 110 and NMOS 120. Particularly, the portions of fins 220a-b that are under the gate structure 230 may form the channel regions of the PMOS 110 and the fins 220c-d form the channel regions for the NMOS 120. While two fins are shown forming the channel region of the PMOS 110 and NMOS 120, in alternative embodiments, any number of fins 220 may be included in each of the transistors. The number of fins may depend on one or more predefined performance specifications of the inverter 200, for example, a desired transistor width.

As illustrated in FIG. 2, the gate structure 230 is a common gate for the PMOS 110 and NMOS 120. The gate structure 230 is generally made from one of polysilicon or amorphous silicon. As shown in FIG. 2, the gate structure 230 may be formed generally perpendicular to the fins 220a-d. A metal layer 251 may be coupled to the gate structure 230 by means of a contact 252, as illustrated in FIG. 2. The metal layer 251 may form an input terminal of the CMOS inverter 200. The metal layers 240, 250, 251, and 260 may be a part of the same or different metal layers.

In some cases, portions of the fins 220a-d may be doped with a suitable dopant. For example, the portions of the fins 220a-d that are not covered by the gate structure 230 may be doped to form extensions of respective source and drain areas 210a-d. For example, the portions 221, 222, 223, and 224 of the fins 210a and 210b may be doped with a p-type dopant and the portions 225, 226, 227, and 228 of fins 210c and 210d may be doped with an n-type dopant. The doping of the fins 210a-d may be performed by means of ion implantation procedure.

As devices become smaller, the fin pitch in devices such as CMOS inverters also become smaller. In other words, fins are formed closer to one another to reduce the overall size of the CMOS inverter so that more inverters can be packed into a single device. However, placing fins too close to one another may adversely affect the formation of the CMOS inverter. For example, doping of the fin structures is usually performed using an ion implantation procedure. Ion implantation doping is typically performed with a high tilt angle, which may prevent one or more faces of one or more fins from being doped due to shadowing effects.

FIG. 3 illustrates shadowing during a high tilt ion implantation procedure. As illustrated in FIG. 3, two fins 310 and 320 may be doped using a high tilt angle, for example, a 45 degree ion implantation procedure. As depicted in FIG. 3 the ions 330 may approach the fins 310 and 320 at a high tilt angle. Because of the proximity of the fins 310 and 320, the fin 320 may block the ions from reaching a surface 311 of fin 310. Therefore, the surface 311 of the fin 310 may not be doped during the ion implantation procedure.

Implant shadowing may affect one or more desired characteristics of the CMOS inverter. For example, referring back to FIG. 2, one or more faces of the portion 221-228 of the fin structures that form source/drain extension regions may not have received any dopants during the ion implantation procedure if the fins 210 are placed too close to one another. This may adversely affect one or more characteristics of the CMOS inverter, for example, the source-drain series resistance.

In some cases, in addition to placing the fin structures in close proximity to each other, the fin structures themselves may be made smaller. For example, a width w (see FIG. 3) of the fin structures may be made smaller to reduce short channel effects in the fins. In some cases, the width w of the fin structures may be less than 10 nm because of required short channel control, depending upon the gate length. In one case, the fin width may be in the range of 7 nm and 8 nm. However, reducing the width w of the fin structures may make the fins mechanically unstable, which may cause them to break during fabrication processes such as ultrasonic cleaning.

SUMMARY OF THE INVENTION

Embodiments of the invention generally relate to an inverter device, and more specifically to a complementary metal-oxide semiconductor (CMOS) inverter device.

One embodiment of the invention provides a CMOS inverter generally comprising a first fin structure having source and drain regions of a first transistor in a first sidewall portion of the first fin structure, wherein the first sidewall portion of the first transistor faces away from a second fin structure. The second fin structure has source and drain regions of a second transistor in a second sidewall portion of the second fin structure, wherein the second sidewall portion of the second transistor faces away from the first transistor. The CMOS inverter further comprises a high-k dielectric layer covering the first sidewall portion and the second sidewall portion and extending into a region between the first fin structure and the second fin structure, and a mid-gap metal gate layer formed on a portion of the dielectric layer.

Another embodiment of the invention provides a method for forming a CMOS inverter. The method generally comprises forming a first fin structure having source and drain regions of a first transistor in a first sidewall portion of the first fin structure, and forming second fin structure having source and drain regions of a second transistor in a second sidewall portion of the second fin structure, wherein the second sidewall portion of the second transistor faces away from the first transistor, and wherein the first sidewall portion of the first transistor faces away from a second fin structure. The method further comprises forming a dielectric layer covering the first sidewall portion and the second sidewall portion and extending into a region between the first fin structure and the second fin structure, and forming a mid-gap metal gate layer on a portion of the dielectric layer.

Yet another embodiment of the invention provides an integrated circuit, generally comprising at least one CMOS inverter. The CMOS inverter generally comprises a first fin structure having source and drain regions of a first transistor in a first sidewall portion of the first fin structure, wherein the first sidewall portion of the first transistor faces away from a second fin structure. The second fin structure has source and drain regions of a second transistor in a second sidewall portion of the second fin structure, wherein the second sidewall portion of the second transistor faces away from the first transistor. The CMOS inverter further comprises a high-k dielectric layer covering the first sidewall portion and the second sidewall portion and extending into a region between the first fin structure and the second fin structure, and a mid-gap metal gate layer formed on a portion of the dielectric layer.

BRIEF DESCRIPTION OF THE DRAWINGS

It is to be noted that the appended drawings illustrate only typical embodiments of this invention and are therefore not to be considered limiting of its scope, for the invention may admit to other equally effective embodiments.

DETAILED DESCRIPTION

Embodiments of the invention provide a CMOS inverter comprising narrowly spaced fins. Transistors may be formed on a sidewall of each fin structure. A high-k dielectric material is deposited on the fins to provide mechanical stability to the fins and serve as a gate dielectric material. A mid gap metal gate layer may be formed on the high-k dielectric layer.

In the following, reference is made to embodiments of the invention. However, it should be understood that the invention is not limited to specific embodiments described herein. Instead, any combination of the following features and elements, whether related to different embodiments or not, is contemplated to implement and practice the invention. The following aspects, features, embodiments and advantages are merely illustrative and are not considered elements or limitations of the appended claims except where explicitly recited in a claim(s).

Figure 4:
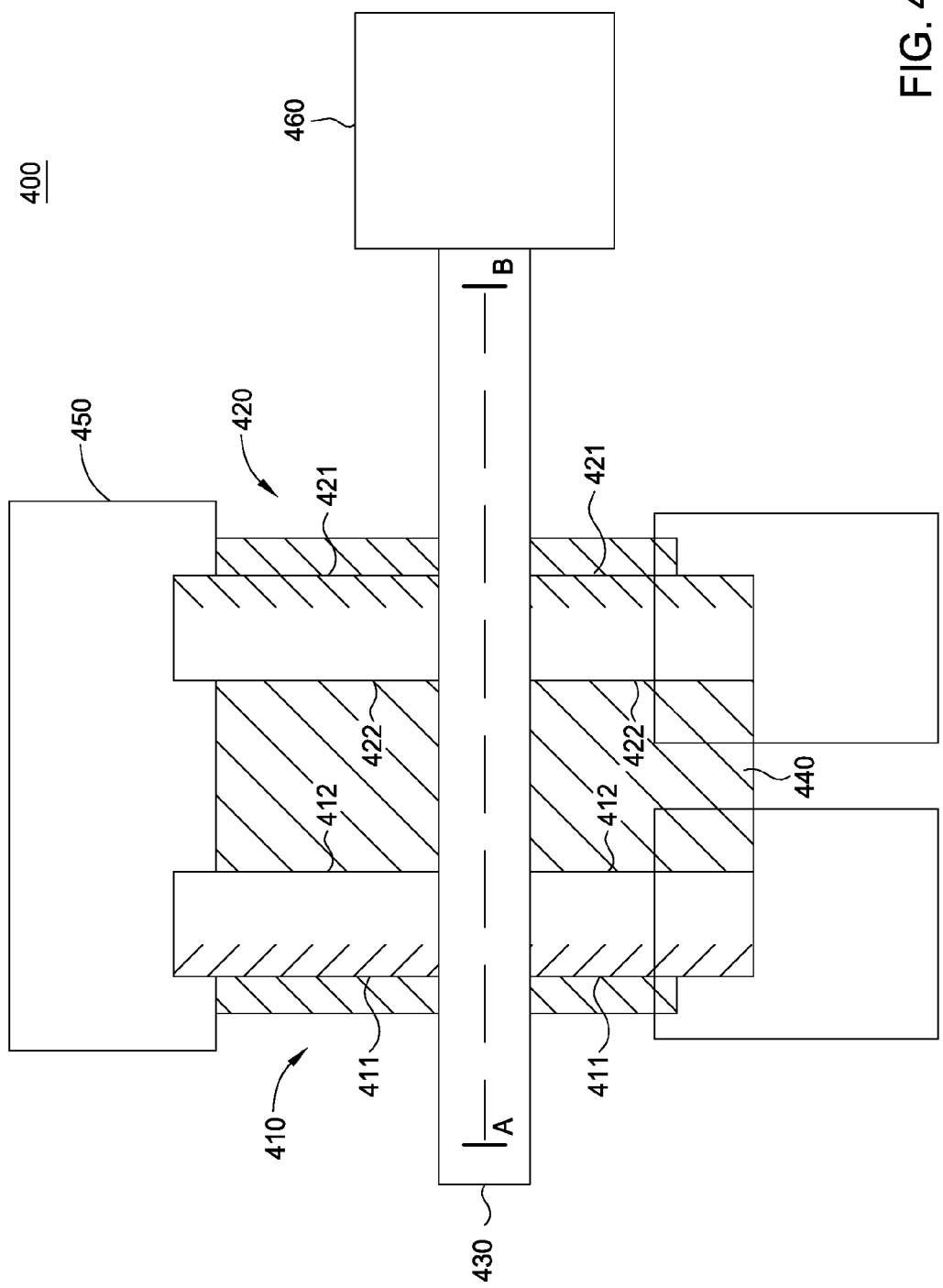
FIG. 4 illustrates a top view of an exemplary CMOS inverter according to an embodiment of the invention.

Embodiments of the invention provide a CMOS inverter device including mechanically stable thin fin structures. FIG. 4 illustrates a top (layout) view of a CMOS inverter device 400 according to an embodiment of the invention. In one embodiment the CMOS inverter device 400 may include closely placed thin fin structures 410 and 420, and a gate structure 430 formed on the fins 410 and 420, as illustrated in FIG. 4. The fin structures 410 and 420 may be ultra thin fin structures. For example, in some embodiments the fin widths may be below 15 nm and the spacing between the fins may be below 100 nm.

In one embodiment of the invention, the gate structure 430 may be formed with a mid-gap metal. For example, in one embodiment, the gate structure 430 may be formed with Titanium-Nitride. Alternatively, any other reasonable metal having similar mid-gap metal properties may be used to form the gate structure 430. The mid gap metal gate structure may be formed on the fins 410 and 420 using standard techniques, for example, a Metal-Organic Chemical Vapor Deposition procedure, an atomic layer deposition procedure, or the like. In one embodiment of the invention a polysilicon or amorphous silicon may be formed on top of metal gate stack to achieve a desired gate thickness.

Figure 1:
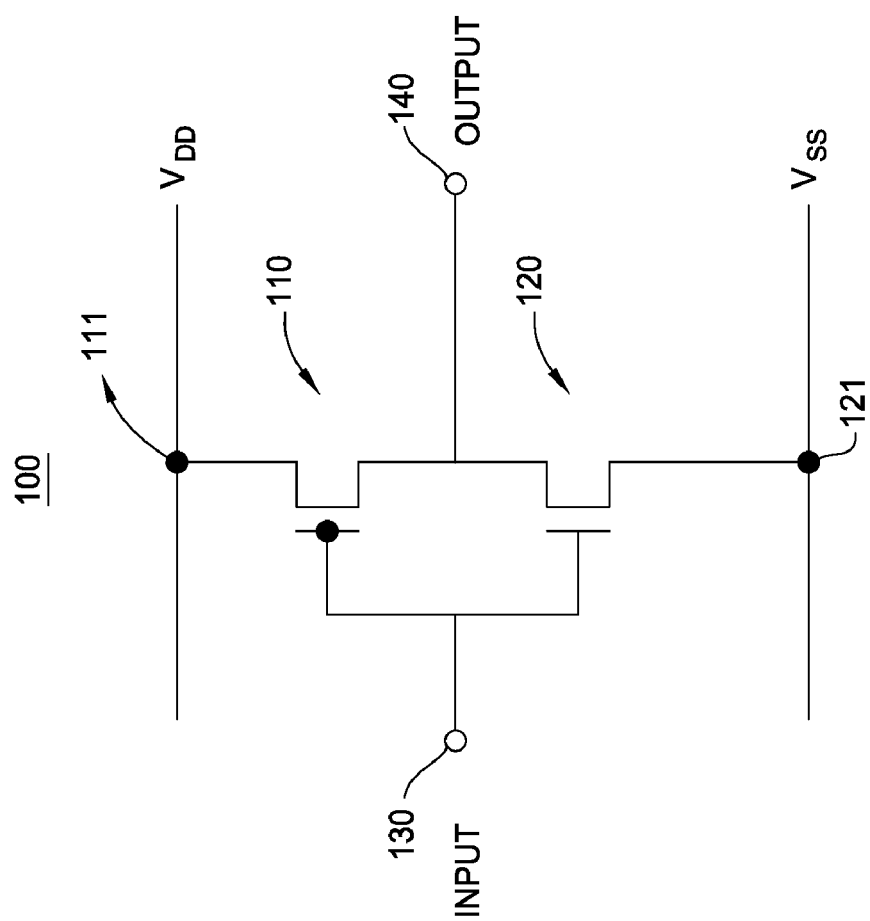
FIG. 1 illustrates an exemplary circuit diagram of a CMOS inverter, according to the prior art.
Figure 2:
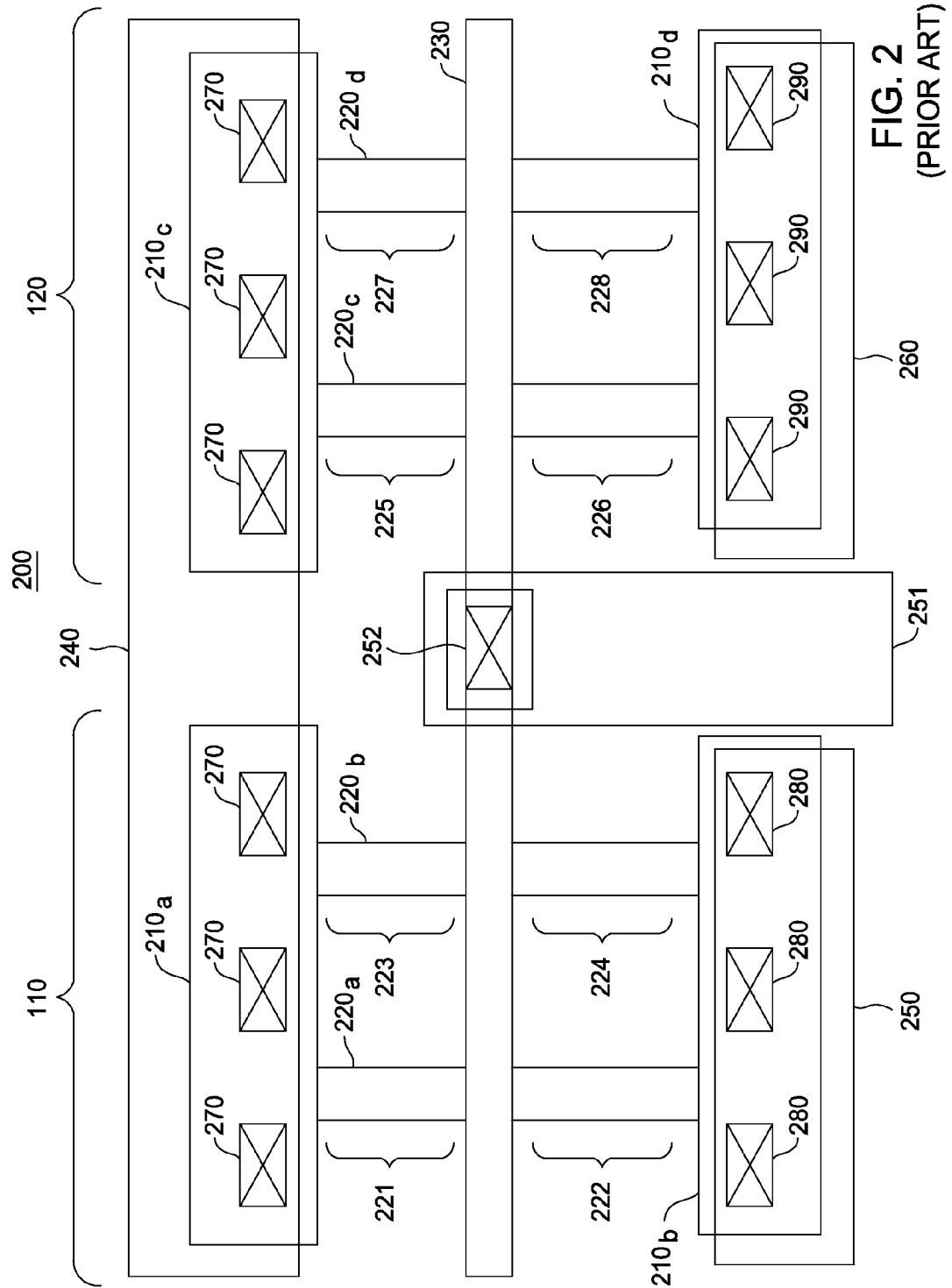
FIG. 2 illustrates an exemplary layout diagram of a CMOS inverter according to the prior art.
Figure 3:
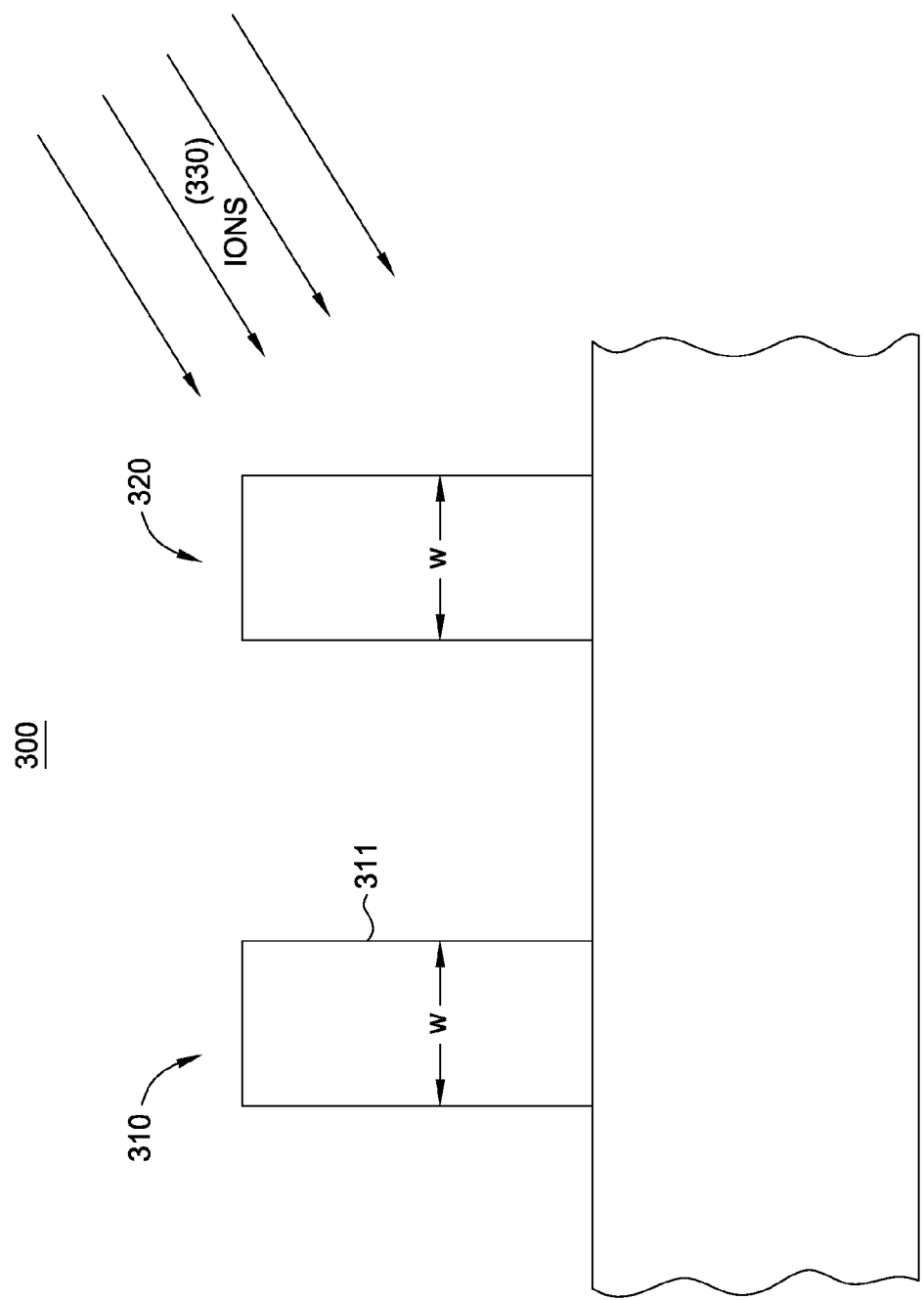
FIG. 3 illustrates implant shadowing, according to an embodiment of the invention.

In one embodiment of the invention, sidewall surfaces of the fin structures 410 and 420 that are not covered by the gate structure 430 may be doped to form source and drain regions of respective PMOS and NMOS transistors. In other words, in comparison to FIG. 2, separate source and drain regions 210 are not provided in the CMOS inverter 400. As illustrated in FIG. 4, a sidewall surface 411 of the fin 410 may be doped with a suitable n-type dopant, and a sidewall surface 421 of the fin 420 may be doped with a suitable p-type dopant. The doping may be performed, for example, using a high-tilt ion implantation procedure such that the sidewalls 412 and 422 of the fins 410 and 420 are not doped. The side wall portions 411 and 421 of the fin structures 410 and 420 may represent source and drain regions of PMOS and NMOS transistors, respectively.

In one embodiment of the invention, the mid-gap metal gate structure may ensure that the PMOS and NMOS transistors formed with the fin structures 410 and 420 have a desired threshold voltage. In some embodiments, an amorphous silicon or polysilicon material (not shown in FIG. 4) may be formed on the gate structure 430, as will be discussed below.

As illustrated in FIG. 4, wrap around contacts 450 and 460 may be formed on the fin structures 410/420 and the gate structure 430. Wrap around contacts may be formed by depositing a contact metal directly on a desired region. For example, the wrap around contact 450 may be formed by depositing a contact metal directly around a portion of the fin structures 410 and 420. The wrap around contact 450 may represent an output of the CMOS inverter 400. Wrap around contact 460 may be formed by directly depositing a contact metal on the gate structure 430. In one embodiment of the invention, the wrap around contact 460 may represent an input to the CMOS inverter 400.

In one embodiment of the invention, the high-k dielectric material 440 may be deposited on the fin structures 410 and 420 prior to forming the mid-gap metal gate structure 430 thereon. The high-k dielectric material, while shown as being between and on the sidewall portions of the fin structures 410 and 410 so as to show the location of the fin structures, may encompass both of the fin structures 410 and 420 in some embodiments.

Figure 5:
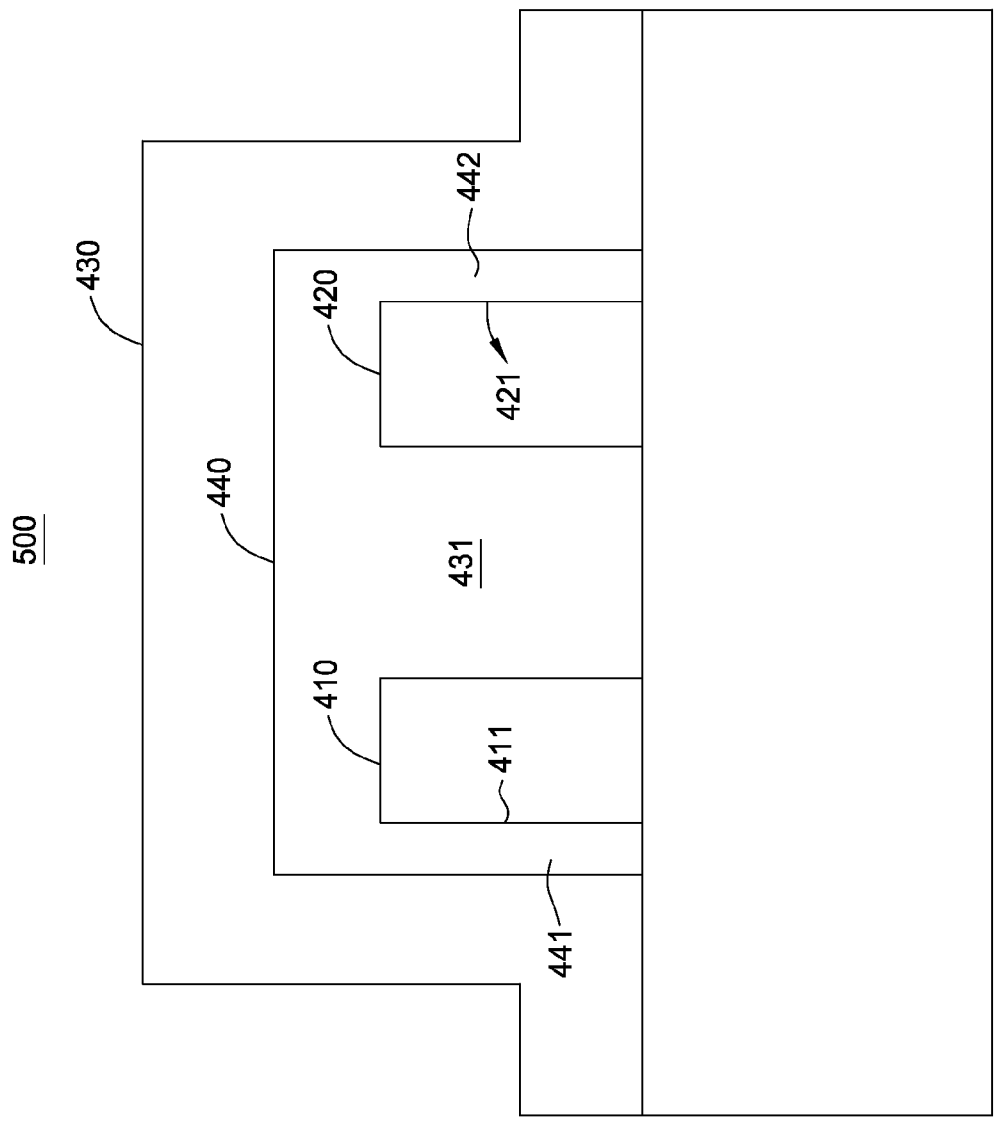
FIG. 5 illustrates a cross sectional view of an exemplary CMOS inverter according to an embodiment of the invention.

FIG. 5 illustrates a cross section of the fin structure 400 along the line A-B in FIG. 4. As illustrated in FIG. 5, the high-k dielectric material 440 encompasses the fins 410 and 420. The gate structure 430 is formed on top of the high-k dielectric material. The sidewall portions 411 and 421 of the fin structures 410 and 420 along the line A-B may be a part of a channel region of respective PMOS and NMOS transistors. For example, the sidewall portion 411 illustrated in FIG. 5 may represent a p-channel region of a PMOS device while the sidewall portion 421 illustrated in FIG. 5 may represent a channel of an NMOS transistor.

In one embodiment of the invention, the portions 441 and 442 of the high-k dielectric material that are adjacent to the side walls 411 and 421 of the fin structure 410 and 420 may perform the function of a gate dielectric material that separates a respective channel region in the fins 410 and 420 from the mid-gap metal gate structure 430. In one embodiment, the high-k dielectric material 440 in the region 431 may serve as an insulator that separates the two fins 410 and 420 and provides the fins with mechanical stability. In one embodiment, the high-k dielectric material may be made from Hafnium based high-k dielectrics, such as HfO2.

The high-k dielectric material may also provide mechanical stability to the fin structures 410 and 420. In other words, by encompassing both the fin structures 410 and 420 therein, the high-k dielectric layer 440 in combination with the embedded fin structures 410 and 420 forms a more mechanically solid structure that may be more mechanically stable than an individual fin. Therefore, the high-k dielectric layer may also prevent the fin structures 410 and 420 from being physically damaged during fabrication steps such as ultra sonic cleaning.

Figure 6A:
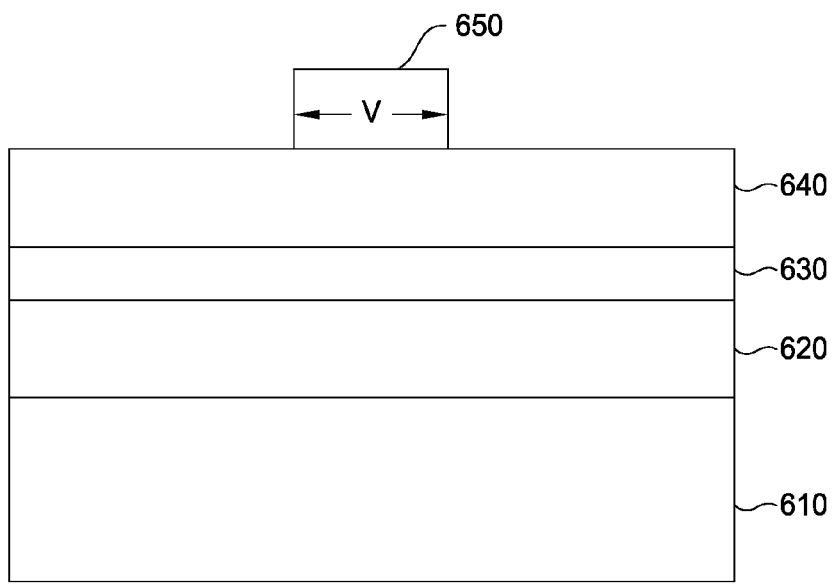
FIGS. 6A-6F illustrate exemplary steps performed during fabrication of a CMOS inverter, according to an embodiment of the invention.

In one embodiment of the invention, the fin structures of the CMOS device 400 may be formed using a spacer defined fin patterning process. FIGS. 6A-6F illustrate exemplary fabrication steps for forming the CMOS device 400 according to an embodiment of the invention. FIG. 6A illustrates an exemplary substrate 600 that may be used to form a CMOS device. As illustrated in FIG. 6A, the substrate 600 may include a first semiconductor layer 610, an oxide layer 620 formed on the semiconductor layer 610, and a second semiconductor layer 630 formed on the oxide layer 620.

The semiconductor layers 610 and 630 may be formed with any suitable semiconductor material such as, for example, silicon, germanium, silicon-germanium, or the like. In one embodiment of the invention, the semiconductor layer 630 may be a silicon on insulator (SOI) layer as it is formed on the oxide layer 620. The oxide layer may be made of any suitable semiconductor oxide, for example, silicon dioxide.

A further oxide layer 640 may be formed on the semiconductor layer 630, as illustrated in FIG. 6A. The oxide layer 640 may also be formed with a suitable semiconductor oxide, for example, silicon dioxide. As illustrated in FIG. 6A, a resist layer 650 may be patterned on the oxide layer 640. Patterning the resist layer may involve, for example, depositing a photosensitive resist material on the substrate 600 using a spin coating method. Thereafter, the photosensitive resist material may be exposed to light having a predefined wavelength through a resist mask. Exposing the photosensitive resist layer to the light may harden a portion of the photosensitive resist layer thereby forming the resist layer 650.

The width v of the resist layer 650 may define a distance between two fin structures of a CMOS device, as will be shown below. In one embodiment of the invention, the resist layer 650 may be used as an etching mask to remove portions of the oxide layer 640 that are not under the resist layer 650. Any suitable wet or dry etchant may be used to remove the exposed portions of the oxide layer 640.

Figure 6B:
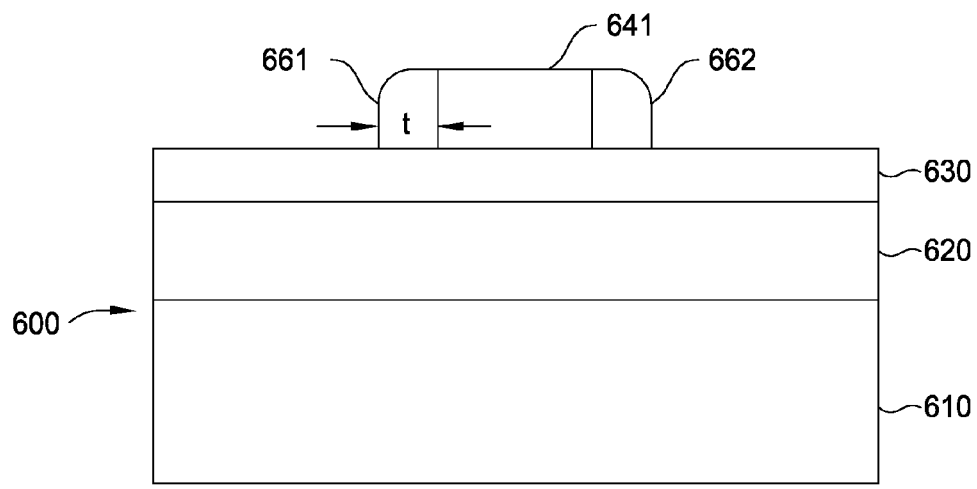

FIG. 6B illustrates a portion 641 that remains after etching the oxide layer 640. In one embodiment of the invention, spacers 661 and 662 may be formed along sidewall portions of the oxide layer 641. The nitride spacers 661 and 662 may be used to define fin structures in the semiconductor layer 630. Therefore, a thickness t of the nitride spacers may be selected to be at or near a desired fin width. For example, in some embodiments, the thickness t of the nitride spacers 661 and 662 may be less than 10 nm. In one embodiment, the thickness t of the nitride spacers 661 and 662 may be in the range of 7 nm and 8 nm.

Figure 6C:
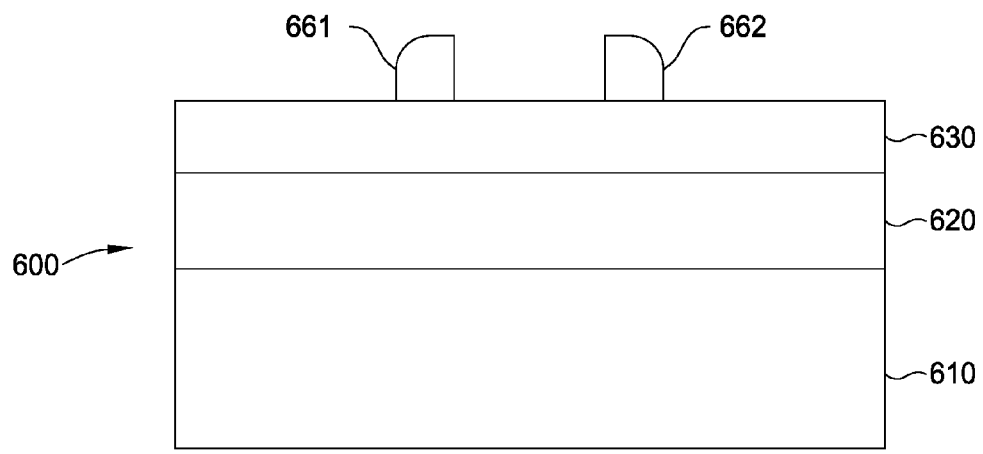
Figure 6D:
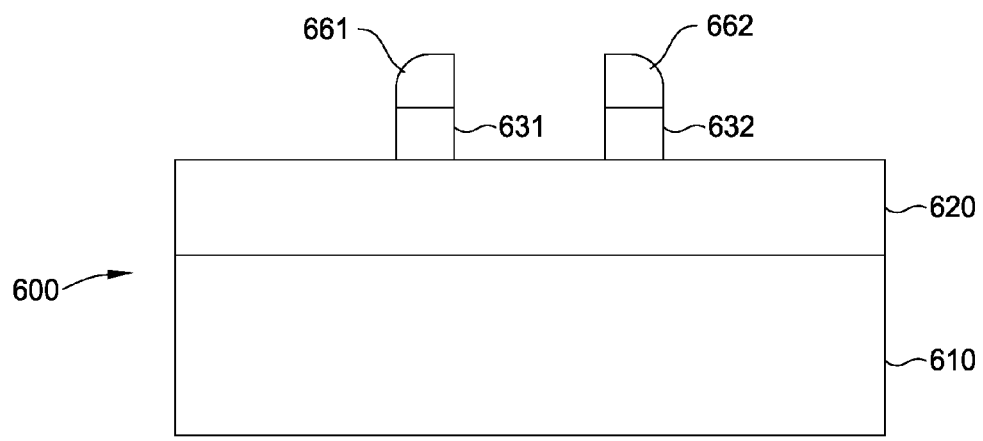

The oxide layer 641 may be removed after the formation of the nitride spacers 661 and 662. FIG. 6C illustrates the substrate 600 after the removal of the oxide layer 641. In a subsequent step, the nitride spacers may be used as a mask to pattern the semiconductor layer 630 to define fin structures therein. For example, portions of the semiconductor layer 630 that are exposed around the nitride spacers 661 and 662 may be removed during an etching process, thereby forming fin structures 631 and 632 under the nitride spacers, as illustrated in FIG. 6D.

Figure 6E:
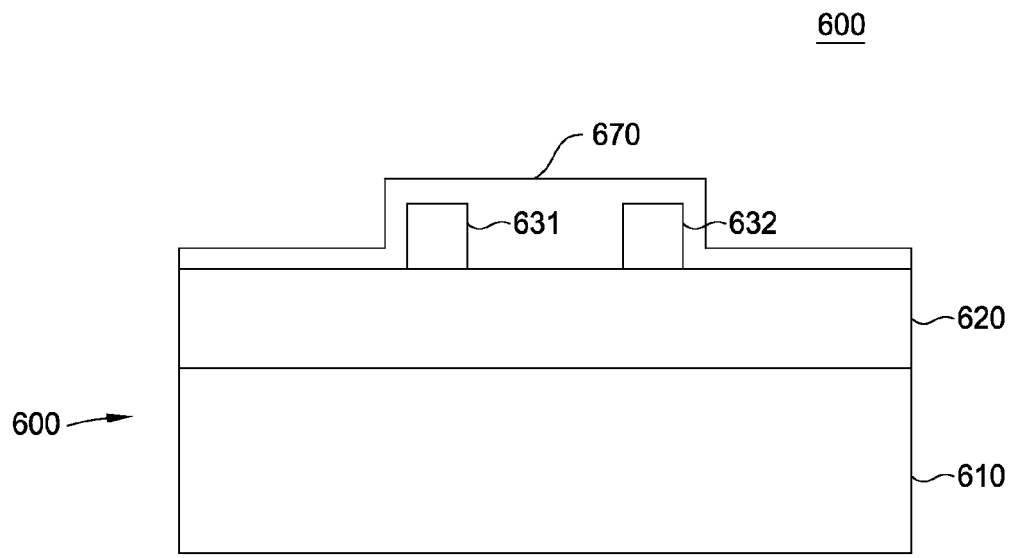
Figure 6F:
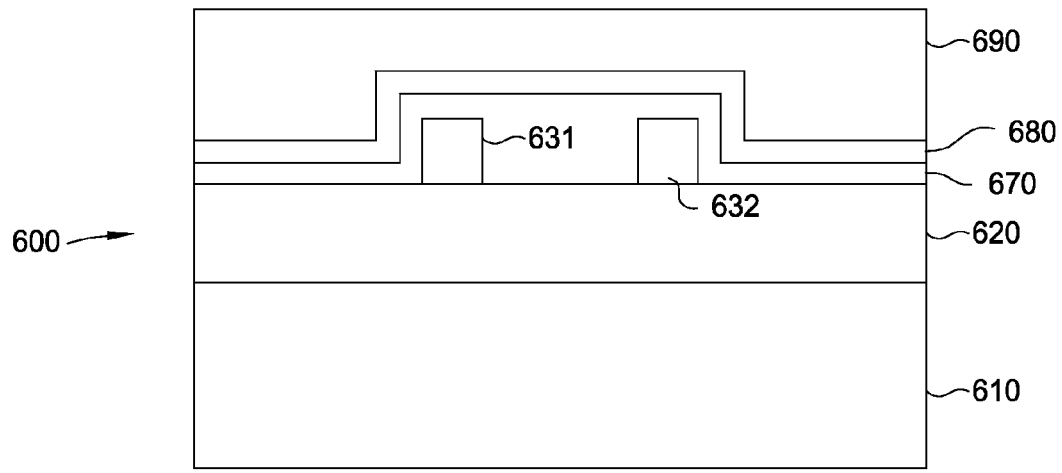

After the formation of the fin structures 631 and 632, a high-k dielectric material 670 may be deposited over the fin structures 631 and 632, as illustrated in FIG. 6E. The high-k dielectric material 670 may correspond to the high-k dielectric material 440 in FIGS. 4 and 5. After forming the high-k dielectric material 670 on the fin structures 631 and 632, a mid gap metal layer 680 may be deposited on a portion of the high-k dielectric layer 670, as illustrated in FIG. 6F, to form a mid-gap metal gate of the CMOS inverter. The mid gap metal gate layer 680 may correspond to the mid-gap metal gate structure 430 in FIGS. 4 and 5.

In one embodiment of the invention, a polysilicon layer 690 may be formed on the mid-gap metal layer 680. The combination of the mid gap metal layer 680 and the polysilicon layer 690 may form a common gate structure for the transistors formed on the sidewalls of the fins structures 631 and 632. The common gate structure also forms an input of the CMOS inverter.

By providing a CMOS inverter that can be formed with closely spaced fin structures having mechanical stability, embodiments of the invention facilitate formation of densely packed integrated circuits with fewer fabrication defects and high reliability.

While the foregoing is directed to embodiments of the invention, other and further embodiments of the invention may be devised without departing from the basic scope thereof, and the scope thereof is determined by the claims that follow.

What is claimed is:

1. A CMOS inverter, comprising:
a first fin structure having source and drain regions of a first transistor in a first sidewall portion of the first fin structure, wherein the first sidewall portion of the first transistor faces away from a second fin structure, wherein a second sidewall portion of the first fin structure is directly opposite of at least one of the source and drain regions of the first fin structure and does not include a dopant used in the source and drain regions of the first fin structure;
the second fin structure having source and drain regions of a second transistor in a first sidewall portion of the second fin structure, wherein the first sidewall portion of the second transistor faces away from the first transistor, wherein a second sidewall portion of the second fin structure is directly opposite of at least one of the source and drain regions of the second fin structure and does not include a dopant used in the source and drain regions of the second fin structure;
a high-k dielectric layer covering at least part of the first sidewall portions of the first and second fin structures, wherein the dielectric layer physically connects the first fin structure to the second fin structure such that a thickness, in a direction perpendicular to top surfaces of the first and second fin structures, of an entire portion of the dielectric layer in a region between the first and second fin structures is greater than respective thicknesses of the first and second fin structures; and
a mid-gap metal gate layer formed on a portion of the dielectric layer.

2. The CMOS inverter of claim 1, wherein the first transistor comprises a PMOS transistor.

3. The CMOS inverter of claim 1, wherein the second transistor comprises a NMOS transistor.

4. The CMOS inverter of claim 1, wherein the drain regions of the first transistor and the second transistor are coupled to each other by means of a wrap around contact.

5. The CMOS inverter of claim 4, wherein the wrap around contact is an output of the CMOS inverter.

6. The CMOS inverter of claim 1, wherein the mid gap metal layer couples gate regions of the first transistor and the second transistor.

7. The CMOS inverter of claim 6, wherein the mid gap metal layer is an input of the CMOS inverter.

8. The CMOS inverter of claim 1, wherein the mid-gap metal layer comprises Titanium-Nitride.

9. The CMOS inverter of claim 1, wherein a width of both the first and second fin structures in a direction perpendicular to the respective first sidewall portions of the first and second fin structures is at most 15 nm, and wherein the first and second fin structures are spaced apart at most 100 nm.

10. A method for forming a CMOS inverter comprising:
forming a first fin structure having source and drain regions of a first transistor in a first sidewall portion of the first fin structure;
forming second fin structure having source and drain regions of a second transistor in a second sidewall portion of the second fin structure, wherein the second sidewall portion of the second transistor faces away from the first transistor, and wherein the first sidewall portion of the first transistor faces away from a second fin structure,
wherein source and drain regions of the first transistor and second transistor are formed in an ion implantation procedure having a tilt angle such that portions of the first and second fin structures on sidewalls opposite the respective source and drain regions are not doped during the ion implantation procedure;
forming a dielectric layer covering at least part of the first sidewall portion and the second sidewall portion, wherein the dielectric layer physically connects the first fin structure to the second fin structure such that a thickness, in a direction perpendicular to top surfaces of the first and second fin structures, of an entire portion of the dielectric layer in a region between the first and second fin structures is greater than respective thicknesses of the first and second fin structures; and
forming a mid-gap metal gate layer on a portion of the dielectric layer.

11. The method of claim 10, wherein the mid-gap metal gate layer is formed in one of an atomic layer deposition procedure and a metalorganic chemical vapor deposition procedure.

12. The method of claim 10, wherein the first transistor comprises a PMOS transistor.

13. The method of claim 10, wherein the second transistor comprises a NMOS transistor.

14. The method of claim 10, further comprising forming a polysilicon layer on the mid-gap metal gate layer.

15. The method of claim 10, further comprising forming a contact on the drain regions of the first transistor and the second transistor.

16. The method of claim 15, wherein the contact is an output of the CMOS inverter.

17. The method of claim 10, wherein the mid gap metal layer forms an input of the CMOS inverter.

18. The method of claim 10, wherein the mid-gap metal layer comprises Titanium-Nitride.

19. The method of claim 10, wherein a width of both the first and second fin structures in a direction perpendicular to the first and second sidewall portions is at most 15 nm, and wherein the first and second fin structures are spaced apart at most 100 nm.

20. An integrated circuit, comprising at least one CMOS inverter, wherein the CMOS inverter comprises:
- a first fin structure having source and drain regions of a first transistor in a first sidewall portion of the first fin structure, wherein the first sidewall portion of the first transistor faces away from a second fin structure, wherein a second sidewall portion of the first fin structure is directly opposite of at least one of the source and drain regions of the first fin structure and does not include a dopant used in the source and drain regions of the first fin structure;
- the second fin structure having source and drain regions of a second transistor in a first sidewall portion of the second fin structure, wherein the first sidewall portion of the second transistor faces away from the first transistor, wherein a second sidewall portion of the second fin structure is directly opposite of at least one of the source and drain regions of the second fin structure and does not include a dopant used in the source and drain regions of the second fin structure;
- a high-k dielectric layer covering at least part of the first sidewall portions of the first and second fin structures, wherein the dielectric layer physically connects the first fin structure to the second fin structure such that a thickness, in a direction perpendicular to top surfaces of the first and second fin structures, of an entire portion of the dielectric layer in a region between the first and second fin structures is greater than respective thicknesses of the first and second fin structures; and
- a mid-gap metal gate layer formed on a portion of the dielectric layer.

21. The integrated circuit of claim 20, wherein the first transistor comprises a PMOS transistor.

22. The integrated circuit of claim 20, wherein the second transistor comprises a NMOS transistor.

23. The integrated circuit of claim 20, wherein the drain regions of the first transistor and the second transistor are coupled to each other by means of a wrap around contact, the wrap around contact forming an output of the CMOS inverter.

24. The integrated circuit of claim 20, wherein the mid gap metal layer couples gate regions of the first transistor and the second transistor, the mid gap metal layer forming an input of the CMOS inverter.

25. The integrated circuit of claim 20, wherein the mid-gap metal layer comprises Titanium-Nitride.

26. The integrated circuit of claim 20, wherein a width of both the first and second fin structures in a direction perpendicular to the respective first sidewall portions of the first and second fin structures is at most 15 nm, and wherein the first and second fin structures are spaced apart at most 100 nm.

* * * * *